United States Patent [19]

Ikeya et al.

[11] Patent Number: 4,801,273
[45] Date of Patent: Jan. 31, 1989

[54] SOCKET

[75] Inventors: Kiyokazu Ikeya, Ueno; Masanori Yagi, Numazu, both of Japan

[73] Assignee: Texas Instruments Incorporated, Dallas, Tex.

[21] Appl. No.: 87,580

[22] Filed: Aug. 20, 1987

[30] Foreign Application Priority Data

Sep. 2, 1986 [JP] Japan ................................. 61-206531

[51] Int. Cl.$^4$ ............................................. H01R 9/09
[52] U.S. Cl. .................................... 439/269; 439/70; 439/264
[58] Field of Search .................................. 439/68–73, 439/259, 262–264, 266, 269, 330, 331, 525, 526

[56] References Cited

U.S. PATENT DOCUMENTS

| | | | |
|---|---|---|---|
| 3,883,207 | 5/1975 | Tomkiewicz | 439/264 |
| 4,420,207 | 12/1983 | Nishikawa | 439/68 |
| 4,491,377 | 1/1985 | Pfaff | 439/298 |
| 4,533,192 | 8/1985 | Kelley | 439/259 |
| 4,623,208 | 11/1986 | Kerul et al. | 439/71 |
| 4,678,255 | 7/1987 | Carter | 439/71 |

*Primary Examiner*—John McQuade
*Attorney, Agent, or Firm*—James P. McAndrews; John A. Haug; Melvin Sharp

[57] ABSTRACT

A socket is described having not only contactors secured to the socket body and electrically connected in an elastically pressed condition of these contactors to a given electrical part mounted but a slide cover slidably fitted to the socket body wherein tapered surfaces are formed in sliding contact areas of such contactors to the slide cover in such a manner that as the slide cover slides a force may be generated to elastically deform and release these contactors from electrical connection to such electrical part.

6 Claims, 4 Drawing Sheets

SOCKET

BACKGROUND OF THE INVENTION

1. Field of the Invention

The invention relates to a socket having contactors that are resiliently pushed to lead pins of a given electrical part mounted, particularly a semiconductor chip with an integrated circuit assembled thereon (hereinafter abbreviated "IC") to establish electrical connections. An example of such socket is the IC chip socket used in the IC chip tester.

2. Description of the Prior Art

In the conventional test of an IC chip, for example, in the heat resistance test in a heating furnace, the IC chip is fitted into a socket 1 as shown in FIG. 1. The body 7 of this socket 1 defines a recessed housing space 5 for housing the IC chip (not shown) where a number of pin contactor 4 (contacts) are disposed on lateral sides of the space 5. To the above socket body 7, a cover 11 and latch 13 are rotatably attached through shafts 10 and 12, respectively. In this construction, the cover 11 is turned in the sense of arrow 14 to fit to the body 7, and the latch 13 is turned in the sense of arrow 15 to hook a locking pawl 17 on an edge 11a of cover 11 for locking.

However, the above socket 1, which is constructed so that the cover 11 may be held in position by the latch 13, has the following weak points:

(1) It is very difficult to open and close the cover 11 when the socket is used on an automatic system;

(2) The leads from the IC chip are fully covered with the cover 11, so that it is difficult to check these legs by eyes for positive contact to individual contactors 4; and (3) It is unavoidable to design the socket body 7 considerably large in comparison to the IC chip.

These problems are partially solved with a socket 21 of FIG. 2. This socket 21 is equipped with a number of pin contactors 4 in such an array that an IC chip 2 is mounted into the housing space 5 from above these contactors around the chip 2 to touch J-shaped lead pins 3 thereon to lead to a given test circuit (not shown). To describe the above mounting mechanism in more detail, first, each contactor 4 is composed of a fixed base, which has lead legs 6 fitted into holes in the socket body 7 with the lower portion thereof exposed below, and a somewhat outwardly bent resilient section 8 extending from the above fixed base. At the top end of the above section 8, there are provided both a pushing member 9 of short height that is pressed to a pin on the IC chip 2 by a resilient force exerted by the above bent section 8 to nippingly hold the chip and a trigger portion 16 that is disposed almost at the same level as the pushing member 9 and held down by a bottom end face 31a of the cover 31. It is noted that this cover 31 may be so designed as to be put onto the body 7 from above and secured thereto by a locking pawl (not shown). On the other hand, the lead legs 6 are inserted into lead throughholes in a printed circuit board (not shown) and soldered. According to the above construction of socket 21, as the cover 31 is held down, the bottom end face 31a thereof pushes the trigger portions 16 of individual contactors 4 to elastically deform these contactors 4 themselves as illustrated by interrupted lines. Since the above deformation occurs in the outward direction toward lateral walls of the housing space 5, an IC chip 2 can be readily inserted from the position indicated by dot-bar lines to the one indicated by interrupted lines. As the cover 31 is released from the force applied, the contactors 4 attempt to restore the original configuration thereof, when a righting force appears to push the pushing members 9 of contactors 4 against the lateral sides of IC chip 2 so these members may nippingly hold the IC chip 2 in the socket 1. As the pushing members 9 are thus brought in resilient contact to the J-shaped pins 3 of IC chip 2, the chip is electrically connected to a given test circuit through these contactors 4. It is noted that the IC chip 2 can readily be removed by holding down the cover 31 again to resiliently deform the contactors 4 as shown by interrupted lines.

However, the above socket 21 has still the following fatal defects:

(1) The bent sections 8 of contactors 4 are short and bent at a small curvature, so a rather large force must be applied to the cover 31 in order to effectively push down the trigger portions of these contactors. This means a more effort in mounting the IC chip 2.

(2) Further, only the elastic righting force that appears when the bent section 8 attempts to restore the original configuration, namely, the position to hold IC chip 2 as shown by the solid lines from the position of elastic deformation as shown by the interrupted lines determines the holding force exerted by the pushing member 9 to the IC chip 2. Accordingly, lowering the force to be applied to the IC chip 2 for insertion thereof means that the pushing force exerted by the pushing member to the IC chip 2, namely, the nippingly holding force is not satisfactorily high.

(3) Particularly, the larger the number of pins on the socket, the higher the force to operate (and particularly hold down) the cover 31. For this reason, the requirement of low operating force limits the number of pins available on the socket.

OBJECTS AND SUMMARY OF THE INVENTION

Accordingly, it is an object of the invention to provide a socket that can be miniaturized and simplified in design and yet allows to readily mount and check an electrical part, for example, an IC chip, holding such electrical part satisfactorily when mounted.

Namely, the invention provides a socket having not only contactors secured to the socket body and electrically connected in an elastically pressed condition of these contactors to a given electrical part mounted but a slide cover slidably fitted to the socket body wherein tapered surfaces are formed in sliding contact areas of such contactors to the slide cover in such a manner that as the slide cover slides a force may be generated to elastically deform and release these contactors from electrical connection to such electrical part.

Other objects, features, and advantages of the invention will appear more fully from the following detailed description thereof taken in connection with the accompanying drawings.

BRIEF DESCRIPTION OF THE DRAWINGS

Namely, FIG. 3 is a schematic perspective view of a socket embodying the invention.

FIG. 4 is a cross-sectional view of the major part of the socket of FIG. 3.

FIG. 5 is a cross-sectional view of the major part of another example of the socket embodying the invention.

FIGS. 6, 7 and 8 are vector diagrams of forces that appear when the contactors are pressed.

DESCRIPTION OF THE PREFERRED EMBODIMENTS

Figure 1:
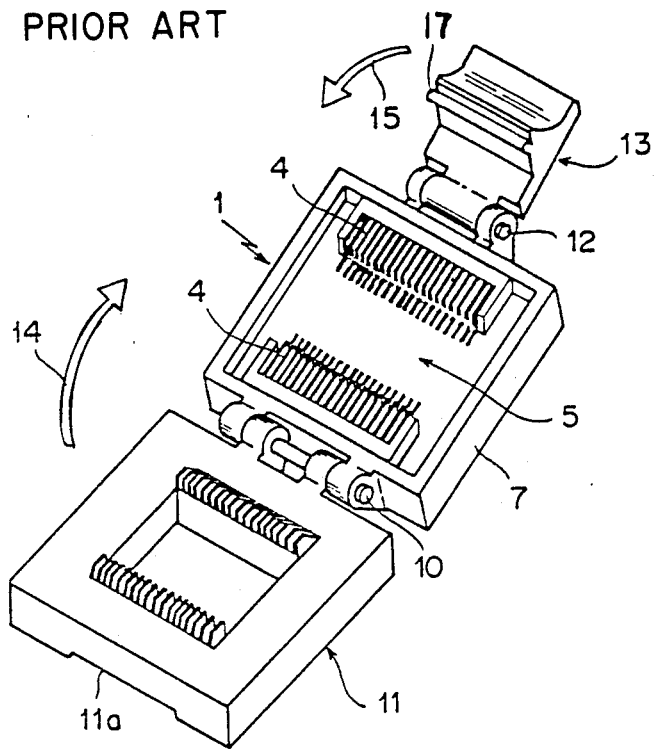
FIG. 1 is a perspective view of a socket of prior art at the opened position thereof.
Figure 2:
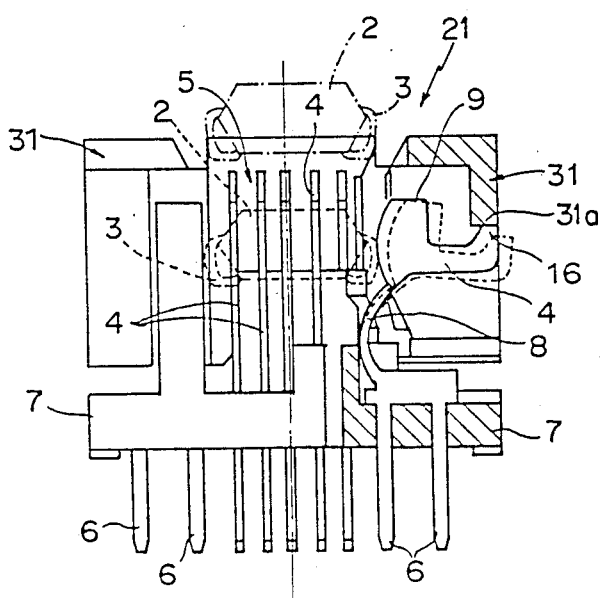
FIG. 2 is a partially cross-sectional front view of another socket of prior art.
Figure 3:
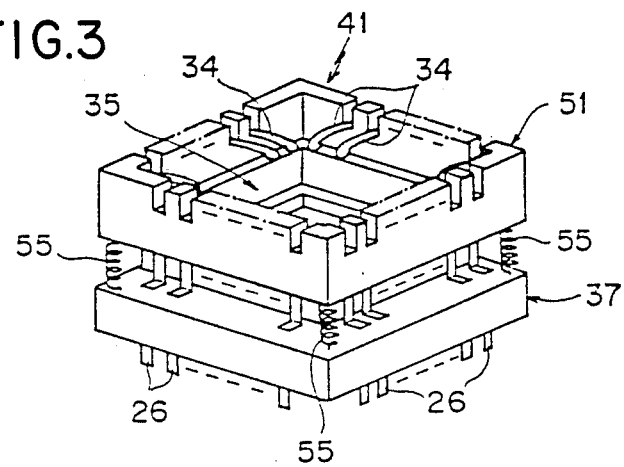
FIGS. 3 to 8 refer to examples of socket embodying the invention.
Figure 4:
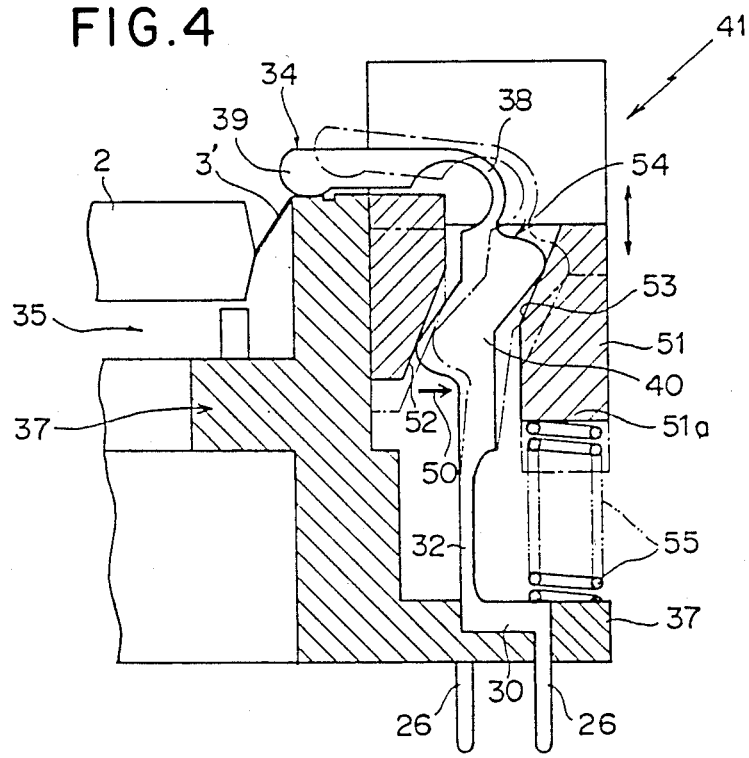

FIGS. 3 and 4 refer to an IC chip socket for IC chip tester embodying the invention. The socket 41 of the above example, though having an appearance basically similar to the socket of FIG. 2, is constructed for a unique mechanism to mount an IC chip 2, effectively achieving high operability and contact force.

Namely, each of contactors 34 is composed of a fixed base 30 secured to the substrate 37, namely, the socket body, a resilient standing section 32 that stands almost perpendicularly from the fixed base 30, a resilient bent section 38 extending from the standing section 32 through an intermediate section 40 and bent enough to form a circular arc, and a pushing member 39 extending continuously from an end of the bent section 38. The intermediate section 40 of each contactor 34 passes through a throughhole 54 formed with tapered surfaces 52 and 53 in the slide cover 51. In the position represented by solid lines, the pushing member 39 pushes a lead 3' of IC chip 2 to the socket body 37 to hold the lead 3' therebetween by an elastic force for electrical connection (in the above drawings, lead legs of contactor 34 are numbered "26"). Between the cover 51 and socket body 37, coil springs 55 are loaded, for example, one at each of four corners, which take an important role in mounting and demounting the IC chip.

For assembly, each contactor 34 is put into the throughhole 54 made in the slide cover 51 from above and the base thereof is pressure fitted to the socket body 37 to provide the fixed base 30. Next, springs 55 are fitted between the cover 51 and socket body 37 and the ends thereof secured. It is noted that component parts of socket 41 can be fabricated by molding an engineering plastic, such as polyether sulfone, polyphenylene sulfide, or the like.

According to the above design of socket 41 as shown in FIG. 4, first, as the cover 51 is held down to squeeze the springs 55 under the bottom face 51a thereof against elastic repulsive forces therefrom. As the cover 51 thus comes down to a position as shown by dot-bar lines, the tapered surface 52 that forms part of the wall of throughhole 54 pushes the intermediate section 40 of contactor in sliding contact thereto to move the intermediate section 40 (and therefore the contactor 34 itself) in the right direction as indicated by an arrow 50 for forced elastic deformation. With the above deformation, the pushing member 39 leaves the lead 3' of IC chip 2 as shown by dot-bar lines to eliminate the electrical connection between both, while allowing to pull up the IC chip 2 for removal. Then, as the force applied to the slide cover 51 to hold down is released, the springs 55 and contactors 34 attempt to elastically restore the original configuration thereof, generating a righting force to push back the cover 51 upward. To mount a second IC chip, the above operation is repeated to hold down the cover 51, put the second IC chip 2 in the housing space 35, and then release the cover 51 from the holding force. The pushing members 39 of contactors 34 then bite the leads 3' with a proper pressure to establish electrical connections. It is noted that being kept in contact to the tapered surfaces 52 and 53 the contactors 34 deform smooth without backlashes.

As mentioned above, use of the socket 41 of the present example makes it significantly easier to insert the IC chip 2 for mounting and is capable of applying sufficiently high holding forces to the mounted IC chip 2. Thus high operability and contact forces are materialized.

Namely, the IC chip can be inserted and pulled out just by holding down the cover 51 against forces from the springs 55, etc. The holding force to hold down the cover 51 is exerted against two kinds of spring forces that can be determined independently, one from the springs 55 and the other from the resilient contactors 34. In other words, the spring force that corresponds to the force necessary to hold down the cover 51 can be shared between the springs 55 and contactors 34. In the above construction, since the holding force to be applied to the cover 51 is primarily the one that can overcome the spring forces from the springs 55, the cover 51 can be held down by applying a rather weak force. What is important here is that because of the above tapered surface the contactors 34 can be readily deformed in the direction of arrow 50 to reduce so much the holding force necessary to hold down the cover 51 while applying a satisfactorily high nipping force (spring force) to the leads 3' of IC chip 2. Further, the righting force from the springs 55 themselves partially contributes to increase such nipping force, so a satisfactorily high contact pressure is applied from the contactors 34 to secure the IC chip 2 positively.

Moreover, use of the slide cover 51 makes it possible to easily insert and remove the IC chip on an automatic machine, improving the working efficiency, while allowing miniaturization and structural simplification of the socket itself. In addition, it is easy to check the mounting condition (namely, the contacting condition of contactors 34) of IC chip by eyes from above the cover 51.

Figure 5:
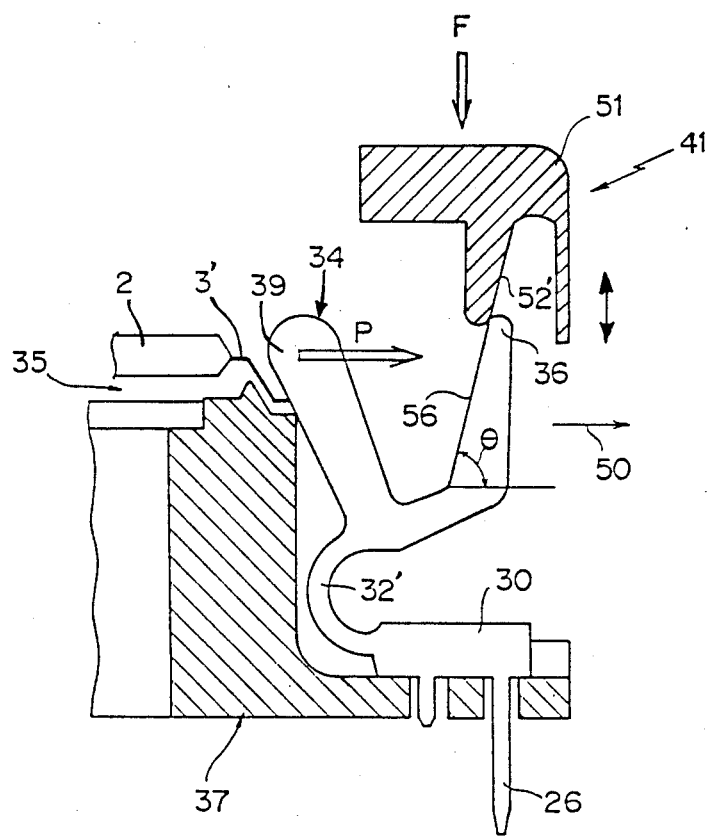

FIG. 5 is a second example of the socket embodying the invention.

This example differs from the one of FIG. 4 in the configuration, etc. of socket components. Particularly, the contactors 34 are each equipped with a trigger portion 36 as mentioned in FIG. 2 and a circular arc 32' extends in a sharp curvature from the fixed base 30. The trigger portion 36 and pushing member 39 branch off from the top end of the circular arc 32', the former tilting outward and the latter inward. Further, tapered surfaces 52' and 56 are formed to come in sliding contact to move the trigger portion 36 in the direction of arrow 50. Namely, as the cover 51 is held down, the tapered surfaces 52' and 56 come in sliding contact to move the trigger portion 36 and thereby elastically deform the circular arc 32'. As a result, the pushing member 39 is released from the lead 3' to open the circuit. The operational principle itself is thus basically the same as mentioned with reference to FIG. 2.

If the frictional force is ignored, the following relation applies between the holding force F applied to the cover 51 and the pressure releasing force P that applies to the contactor 34:

$$F = P \tan(\pi/2 - \theta) \text{ [rad]}, \tag{1}$$

where "$\theta$" is the tilting angle of the contact area of the above trigger portion 36 and tapered surface 52'. Accordingly, F changes with the angle and, if $\theta > \pi/4$, F<P, which means a low operating force and maintenance of a high contact pressure P. A higher angle $\theta$ reduces the operating force. Thus, even with a socket having 100 contact pins, the cover 51 can be held down by applying a small holding force F, for example, as low as about 3 kgf while the contact pressure can be kept at a high level. It is noted that the force to push the cover 51 upward can be generated by providing springs 55 as already mentioned (see FIG. 2) though these springs are omitted in FIG. 5.

Figure 6:
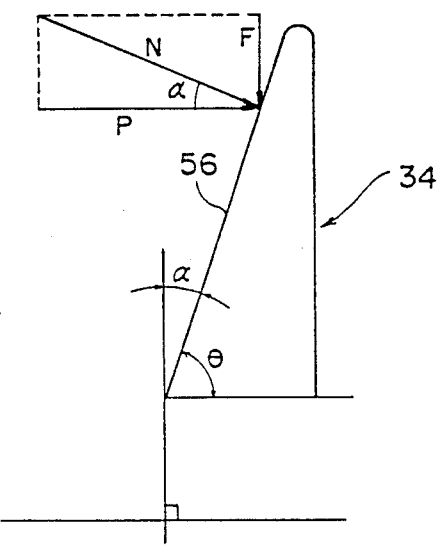
Figure 7:
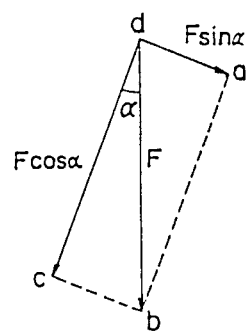
Figure 8:
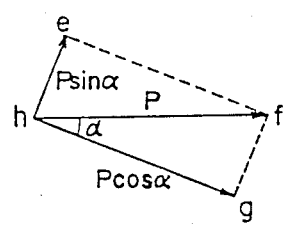

Referring to FIGS. 6 to 8, the above equation (1) can be derived as follows. First, a vector diagram of FIG. 6 applies where $\alpha=(\pi/2)-\theta$. In the diagram, the force F is composed of a component parallel to the tapered surface or F cos $\alpha$ and one perpendicular thereto or F sin $\alpha$. Similarly, the force P in the diagram of FIG. 8 is composed of the parallel component P sin $\alpha$ and perpendicular component P cos $\alpha$. The equilibrium of the components parallel to the tapered surface (a—b of FIG. 5 and f—g of FIG. 6) is expressed, $$F \cos \alpha = P \sin \alpha.$$

Therefore, $$F = P \tan \alpha \text{ (since } \sin \alpha/\cos \alpha = \tan \alpha\text{)}.$$

Or $$F = P \tan [(\pi/2) - \theta].$$

It is noted that the following inequalities apply:
If $\alpha < 45°$, F<P; and
If $\alpha > 45°$, F>P.

Also in the example of FIGS. 3 and 4, the tapered surfaces 52' and 56 give a similar effect. It is noted that also the example of FIG. 5 can achieve miniaturization, simplification, and other effects of the invention as mentioned with the former example.

It will be evident that various modifications can be made to the described embodiments without departing from the scope of the present invention.

For example, the bent section and pushing member of contactor given in FIGS. 3 to 5 can variously be modified in configuration. The contactor has, so to say, two springy parts, so by changing spring constants of these two springy parts it will be able to effectively achieve a lower operating force and higher contact force. Generally, these two features are incompatible with each other. In the invention, however, these features can be materialized simultaneously. Namely, the low operating force can be achieved by designing the bent section for a low elastic modulus while the latter by use of a high elastic modulus of the other springy part. Also the configuration and structure of slide cover, and the angle of tapered surface can be modified. It is noted that both or either of the cover and contactor may have a tapered surface or surfaces. Though in the above example the pushing force from the contactor is generated primarily in the downward direction (namely, in the direction of IC chip insertion), a different design can be used to generate such force primarily in the transverse direction to nippingly hold the IC chip from lateral sides. In this case, leads of the IC chip are preferably J-shaped pins. In the above examples, the IC chip is nippingly held by contactors from four lateral sides but a modification can be made to nippingly hold the chip from two lateral sides or from two opposite directions. Further, coil springs, if provided between the slide cover and socket body, can be changed variously in configuration, number, fitting method, and/or type. The coil springs may be disposed to exert spring forces in a direction reverse to the aforementioned example or these springs may be replaced with other resiliently deformable members, for example, leaf springs. It is a matter of course that the socket of the invention can be designed to mount an electrical part other than the aforementioned IC chip.

In the present invention, tapered surfaces are formed, as mentioned above, in areas where the slide cover and contactors are brought in sliding contact so as the slide cover slides these contactors may elastically deform to establish electrical connections or remove such connections. Accordingly, by the action of these tapered surfaces, the force to be applied to the slide cover can be made not only smaller than the pushing force exerted by the contactors to the electrical part involved but weaker than in the case where the contactors are imply pushed for deformation. For this reason, the electrical part can be mounted and demounted more readily. Further, since the spring force exerted by the contactors to the electrical part can be set large enough to positively hold that part. In addition, the slidable construction of the slide cover allows miniaturization and structural simplification of the socket itself while permitting to check the fitting condition of the electrical part by eyes.

What is claimed is:

1. A socket having contactors secured at one end thereof to a socket body, and a slide cover slidably fitted to said socket body, said contactors being disposed in such positions that said contactors may be electrically connected in an elastically pushed condition of said contactors to a given electrical part as said electrical part is mounted on the socket, wherein a tapered surface is formed in each sliding contact area between the respective contactors and said slide cover in such a manner that, as said slide cover slides, a force is generated to elastically deform said contactors and thereby release said contactors from said electrical part to remove electrical connections of the contactors relative to said electrical part, each of said contactors comprising a fixed base disposed at one end thereof and secured to said socket body, a resilient standing section that stands almost perpendicularly from said fixed base, a resilient bent section fully bent in a circular arc and extending via an intermediate section form the top end of said standing section, and a pushing member disposed to extend from said bent section, wherein said intermediate section of each contactor passes through a throughole in said slide cover having said tapered surface made in the wall thereof.

2. A socket as claimed in claim 1 wherein as said slide cover slides said tapered surfaces are brought in sliding contact to said intermediate section to elastically deform said contactors.

3. A socket having contactors secured at one end thereof to a socket body, and a slide cover slidably fitted to said socket body, said contactors being disposed in such positions that said contactors may be electrically connected in an elastically pushed condition of said contactors to be a given electrical part as said electrical part is mounted on the socket, wherein a tapered surface is formed in each sliding contact area between the respective contactors and said slide cover in such a manner that, as said slide cover slides, a force is generated to elastically deform said contactors and thereby release said contactors from said electrical part to remove electrical connections of the contactors relative to said electrical part, each of said contactors comprising a fixed base disposed at one end thereof and secured to said socket body, a bent section continuously disposed next to said fixed base and fully bent to form a circular arc, and a trigger portion and a pushing member branching upward from the top end of said bent section and tilting outward and inward, respectively, with an inside face of said trigger portion providing said tapered surface.

4. A socket as claimed in claim 3 wherein as said slide cover is brought in sliding contact to said tapered surface of said trigger portion said contactors undergo elastic deformation.

5. A socket as claimed in claim 4 wherein said slide cover has a tapered surface which is brought in sliding contact to said tapered surface of trigger portion.

6. A socket as claimed in claim 3 wherein as said slide cover is held down, the holding force F to hold down said slide cover is related to the pressure releasing force P to release said contactors from electrical connections by the following expression:

$$F = P \tan(\pi/2 - \theta) \text{ [rad]}$$

where $\theta > \pi/4$, $\theta$ being the angle between the direction in which said trigger section moves as said slide cover is held down and said tapered surface.

* * * * *